(12) United States Patent
Slaughter

(10) Patent No.: US 8,514,615 B2
(45) Date of Patent: Aug. 20, 2013

(54) STRUCTURES AND METHODS FOR A FIELD-RESET SPIN-TORQUE MRAM

(75) Inventor: Jon Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 161 days.

(21) Appl. No.: 12/895,057

(22) Filed: Sep. 30, 2010

(65) Prior Publication Data

US 2012/0081950 A1 Apr. 5, 2012

(51) Int. Cl.
*G11C 11/00* (2006.01)

(52) U.S. Cl.
USPC ........................... 365/158; 365/148; 365/171

(58) Field of Classification Search
USPC .............. 365/48, 55, 62, 66, 74, 78, 80–93,
365/100, 130, 131, 148, 158, 171–173, 225.5,
365/243.5; 257/421, E21.665; 438/3;
977/933–935
See application file for complete search history.

(56) References Cited

U.S. PATENT DOCUMENTS

| | | | |
|---|---|---|---|
| 6,721,201 B2 | 4/2004 | Ikeda | |
| 7,532,506 B2 * | 5/2009 | Dittrich et al. | 365/158 |
| 7,924,607 B2 * | 4/2011 | Yoshikawa et al. | 365/158 |
| 2003/0184918 A1 * | 10/2003 | Lin et al. | 360/314 |
| 2003/0235016 A1 * | 12/2003 | Gill | 360/324.12 |
| 2004/0021189 A1 * | 2/2004 | Yoda et al. | 257/421 |
| 2004/0109264 A1 * | 6/2004 | Gill | 360/324.2 |
| 2004/0246776 A1 * | 12/2004 | Covington | 365/173 |
| 2004/0249428 A1 * | 12/2004 | Wang et al. | 607/116 |
| 2006/0019487 A1 | 1/2006 | Leuschner et al. | |
| 2006/0203539 A1 | 9/2006 | Ikeda et al. | |
| 2007/0023807 A1 | 2/2007 | Haratani et al. | |
| 2008/0020491 A1 | 1/2008 | Ingvarsson et al. | |
| 2008/0253174 A1 * | 10/2008 | Yoshikawa et al. | 365/158 |
| 2008/0310215 A1 * | 12/2008 | Ueda | 365/158 |
| 2009/0073749 A1 * | 3/2009 | Dittrich et al. | 365/158 |
| 2009/0080124 A1 * | 3/2009 | Yoshikawa et al. | 360/324.12 |
| 2009/0168493 A1 | 7/2009 | Kim et al. | |
| 2009/0243009 A1 | 10/2009 | Li et al. | |
| 2010/0009467 A1 | 1/2010 | Horng et al. | |
| 2010/0109106 A1 | 5/2010 | Zhong et al. | |

OTHER PUBLICATIONS

U.S. Appl. No. 12/789,838 filed May 28, 2010.

(Continued)

*Primary Examiner* — Harry W Byrne
(74) *Attorney, Agent, or Firm* — Ingrassia Fisher & Lorenz, P.C.

(57) ABSTRACT

An apparatus and method of programming a spin-torque magnetoresistive memory array includes a conductive reset line positioned near each of a plurality of magnetoresistive bits and configured to set the plurality of magnetoresistive memory elements to a known state having magnetization perpendicular to the film plane of the magnetoresistive bits by generating a magnetic field when an electrical current flows therethrough. The conductive reset line is positioned such that the magnetic field is applied with a predominant component perpendicular to the film plane when an electrical current of predetermined magnitude, duration, and direction flows through the first conductive reset line. Another conductive reset line may be positioned wherein the magnetic field is created between the two conductive reset lines. A permeable ferromagnetic material may be positioned around a portion of the conductive reset line or lines to focus the magnetic field in the desired direction by positioning edges of permeable ferromagnetic material on opposed sides of the film plane. A spin torque transfer current is applied to selected ones of the magnetoresistive bits to switch the selected bit to a programmed state.

18 Claims, 10 Drawing Sheets

(56) References Cited

OTHER PUBLICATIONS

International Search Report and Written Opinion mailed Jan. 31, 2012 in PCT/US11/52187.

The International Bureau of WIPO, PCT, International Preliminary Report on Patentability and Written Opinion of the International Searching Authority for PCT International Application No. PCT/US2011/052187, mailed Apr. 11, 2013.

\* cited by examiner

US 8,514,615 B2

STRUCTURES AND METHODS FOR A FIELD-RESET SPIN-TORQUE MRAM

TECHNICAL FIELD

The exemplary embodiments described herein generally relate to magnetoresistive memories and more particularly to structures and methods of reading and programming a spin-torque magnetoresistive random access memory (MRAM) having a field-reset capability.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low and high electrical resistance states, respectively. Accordingly, a detection of the resistance allows a magnetoresistive memory element, such as an MTJ device, to provide information stored in the magnetic memory element. There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element. In some device designs the free magnetic layer of the MTJ may have stable magnetic states with magnetization in the film plane, and in other cases the stable states have magnetization perpendicular to the plane. In-plane devices typically have their magnetic easy axis defined by the in-plane shape of the free layer and perpendicular devices typically employ materials with a perpendicular magnetic anisotropy (PMA) that create a perpendicular easy axis.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bitcell select devices in both current directions can limit the scalability of ST-MRAM. The write current is typically higher in one direction compared to the other, so the select device must be capable of passing the larger of the two currents. In addition, ST-MRAM switching current requirements increase as the write current pulse duration is reduced. Because of this, the smallest ST-MRAM bitcell approach may require relatively long switching times.

One approach to manage the increasing MTJ resistance variability as ST-MRAM is scaled is to use a self-referenced read operation to determine the state of the bits. One such self-referenced read operation would bias a bit to a desired voltage and maintain a reference reflecting the required current, then switch the bit to a known state. The original state of the bit can be determined by comparing the current required to bias the bit in the new state to the current that was required in the original state. No change in current would indicate that the original state matched the switched state, while a change in current in the expected direction would indicate that the original state was opposite of the switched state.

Where a self-referenced read operation can overcome the impact of MTJ resistance variation, it may also increase the read time requirement. The relatively long time required for a self-referenced read operation in conjunction with the relatively long ST-MRAM write times (compared to static random access memory (SRAM), for example) make high sequential bandwidth read and write approaches, like those used by dynamic random access memories (DRAMs), more desirable. In the approach used by DRAMs, a large page of bits (several thousand) are read simultaneously and the values are each stored in a latch, then at much higher speed, subsets of the page of bits are read out of the part. For writes in DRAMs, data is similarly written to subsets of the page, after which there is a time required to complete the write process. DRAM interfaces, such as synchronous dynamic random access memory (SDRAM) and double data rate (DDR) DRAM, are designed to maximize sequential bandwidth while allowing for the naturally slow random cycle time of DRAM technology. ST-MRAM may benefit from a similar approach; however, one key challenge would be managing the power required to read and write a large page of bits at high bandwidth.

Accordingly, it is desirable to provide ST-MRAM structures and methods that shorten a self-referenced read operation, reduce the power requirement when performing a self-referenced read operation to a plurality of bits, or enable a memory to function with ST-MRAM switching that only requires current be applied through the MTJ in the one direction having the lower critical current requirement. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for programming and reading a spin-torque magnetoresistive random access memory.

A spin-torque magnetoresistive memory comprises a plurality of magnetoresistive memory elements formed from a plurality of layers defining a film plane; a first conductive reset line positioned adjacent each of the plurality of magnetoresistive memory elements and configured to set the plurality of magnetoresistive memory elements to a known magnetic state having magnetization perpendicular to the film plane by generating a magnetic field with a predominant component perpendicular to the film plane when an electrical current of predetermined magnitude, duration, and direction flows through the first conductive reset line; a first permeable ferromagnetic material positioned on at least one side of the first conductive reset line and having at least one edge positioned parallel to the film plane and outside of the film plane; a bit line coupled to the plurality of magnetoresistive memory elements; and circuitry coupled to the bit line and configured to apply a spin torque transfer current through the bit line to selected ones of the plurality of magnetoresistive memory elements.

Another exemplary embodiment includes method of operating a spin-torque magnetoresistive memory including a bit line coupled to each of a plurality of magnetoresistive memory elements, circuitry coupled to the bit line, and a conductive reset line positioned near the plurality of magnetoresistive memory elements, each of the magnetoresistive memory elements defining a plane having a magnetic easy axis perpendicular to the plane, the method comprising setting the plurality of magnetoresistive memory elements to a first state by applying a reset current through the conductive reset line to apply a predominant component of a focused magnetic field perpendicular to the plane of each of the plurality of magnetoresistive memory elements; and programming selected ones of the plurality of magnetoresistive memory elements to a second state by applying a spin torque transfer current through the selected magnetoresistive memory elements from the circuitry to the bit line.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

A magnetoresistive random access memory (MRAM) array includes a conductive reset line positioned near each of a plurality of magnetoresistive bits. A write, or program, operation begins when an electrical current is applied to the conductive reset line for generating a magnetic field to set the plurality of bits to a reset state. When PMA materials are used for the free layer, the positioning of the conductive reset lines and the magnetoresistive bits is such that the magnetic field is within the range of 60 to 90 degrees, and preferably 90 degrees, to the surface of the magnetoresistive bits. For devices having in-plane magnetized free layers, the positioning of the conductive reset lines and the magnetoresistive bits is such that the magnetic field is predominantly in the film plane of the free layer. A permeable ferromagnetic material, also known also as a cladding material, may be positioned on a portion of the conductive reset lines to focus the magnetic field in the desired direction. A spin torque transfer (STT) current is then applied to selected ones of the magnetoresistive bits to switch the selected bit to the opposite programmed state. During a read operation, a resistance of each of the plurality of bits is sensed prior to generating a reset magnetic field with the program line. The resistance is again sensed after the magnetic field is generated, changing the state of the bits in the opposite programmed state and thus allowing the initial state of all the bits to be determined. The STT current is then applied to those magnetoresistive bits having a resistance different from prior to the magnetic field being applied, returning them to their initial state. Some embodiments require a STT current be applied in only one direction, and allow for the use of bipolar technology to provide the STT current.

Figure 1:
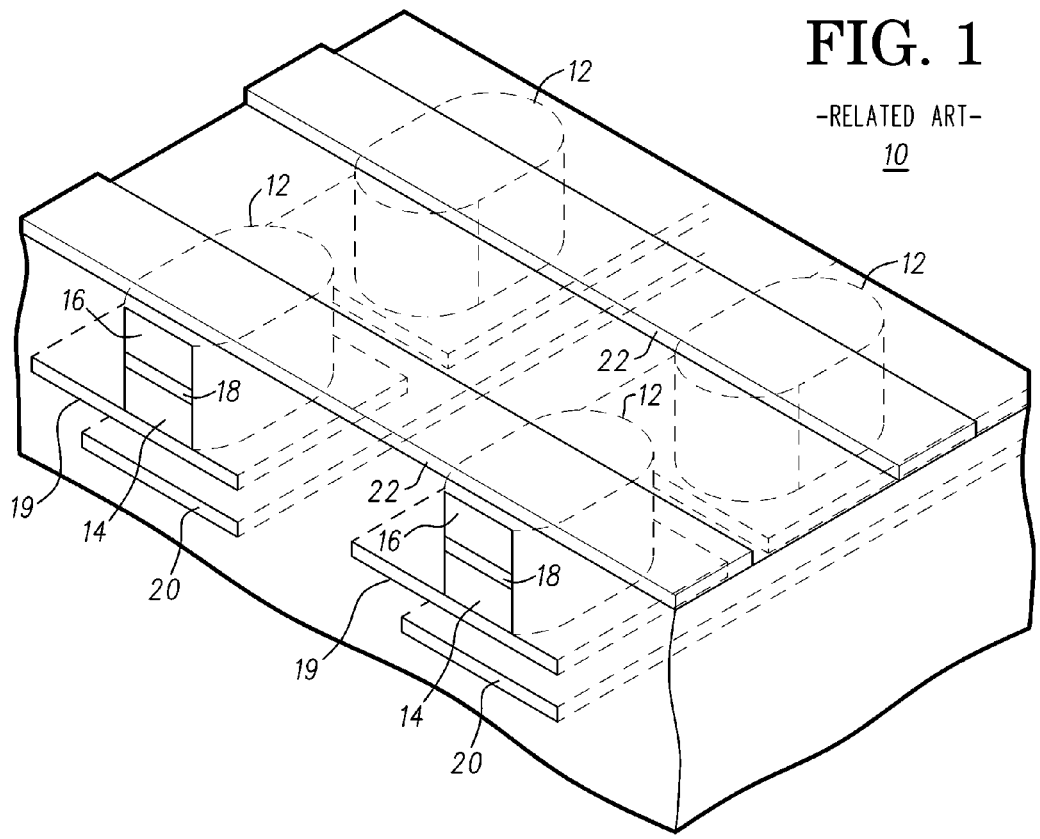
FIG. 1 is a typical field-switched MRAM memory element array.

MRAM technology uses magnetic components to achieve non-volatility, high-speed operation, and excellent read/write endurance. FIG. 1 illustrates a conventional memory element array 10 having one or more memory elements 12. An example of one type of magnetoresistive memory element, a magnetic tunnel junction (MTJ) element, comprises a fixed ferromagnetic layer 14 that has a magnetization direction fixed with respect to an external magnetic field and a free ferromagnetic layer 16 that has a magnetization direction that is free to rotate with the external magnetic field. The fixed layer and free layer are separated by an insulating tunnel barrier layer 18. The resistance of memory element 12 relies upon the phenomenon of spin-polarized electron tunneling through the tunnel barrier layer between the free and fixed ferromagnetic layers. The tunneling phenomenon is electron spin dependent, making the electrical response of the MTJ element a function of the relative magnetization orientations and spin polarization of the conduction electrons between the free and fixed ferromagnetic layer.

The memory element array 10 includes conductors 20, also referred to as digit lines 20, extending along rows of memory elements 12, conductors 22, also referred to as bit lines 22, extending along columns of the memory elements 12, and conductor 19, also referred to as a bottom electrode 19, electrically contacting the fixed layer 14. While the bottom electrodes 19 contact the fixed ferromagnetic layer 14, the digit line 20 is spaced from the bottom electrodes 19 by, for example, a dielectric material (not shown). A memory element 12 is located at a cross point of a digit line 20 and a bit line 22. The magnetization direction of the free layer 16 of a memory element 12 is switched by supplying currents to bottom electrode 19 and bit line 22. The currents create magnetic fields that switch the magnetization orientation of the selected memory element from parallel to anti-parallel, or vice versa. To sense the resistance of element 12 during the read operation, a current is passed from a transistor in the substrate (not shown) through a conductive via (not shown) connected to bottom electrode 19.

Figure 2:
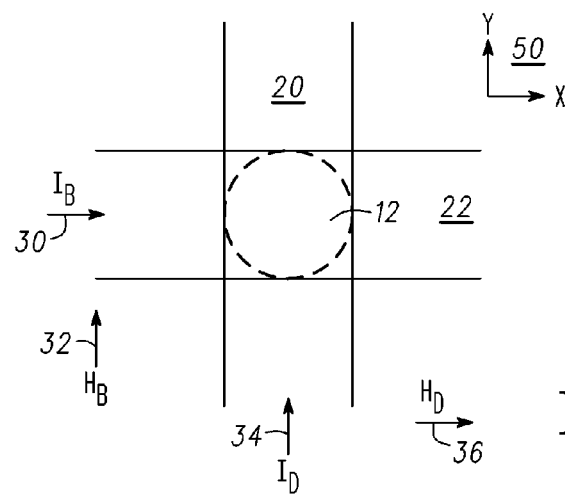
FIG. 2 illustrates magnetic fields generated at a memory element of a typical field-switched MRAM memory element array.

FIG. 2 illustrates the fields generated by a conventional linear digit line 20 and bit line 22. To simplify the description of MRAM device 10, all directions will be referenced to an x- and y-coordinate system 50 as shown. A bit current $I_B$ 30 is defined as being positive if flowing in a positive x-direction and a digit current $I_D$ 34 is defined as being positive if flowing in a positive y-direction. A positive bit current $I_B$ 30 passing through bit line 22 results in a circumferential bit magnetic field, $H_B$ 32, and a positive digit current $I_D$ 34 will induce a circumferential digit magnetic field $H_D$ 36. The magnetic fields $H_B$ 32 and $H_D$ 36 combine to switch the magnetic orientation of the memory element 12.

The traditional MRAM switching technique, using magnetic fields generated by current-carrying lines adjacent to the memory element, depicted in FIG. 2, has some practical limitations, particularly when the design calls for scaling the bit cell to smaller dimensions. For example, decreasing the physical size of the MTJ elements results in lower stability against unwanted magnetization reversal due to thermal fluctuations, because the energy barrier to thermal reversal decreases with decreasing free layer volume. The stability of the bit can be enhanced by increasing the magnetic anisotropy which also results in an increased switching field. The magnitude of the magnetic fields $H_D$ 36 or $H_B$ 32 per milli-Ampere of current $I_D$ 34 or $I_B$ 30 increases with decreasing line width, which would help reach the higher switching field, but only if the lines are moved proportionally closer to the MTJ, which is not normally possible. In addition, the line resistance increases with decreasing line width, requiring shorter lines which results in lower array efficiency. Furthermore, the bit-to-bit variation in switching field increases with decreasing bit size, requiring even more current to overcome the distributions and achieve reliable switching.

Figure 3:
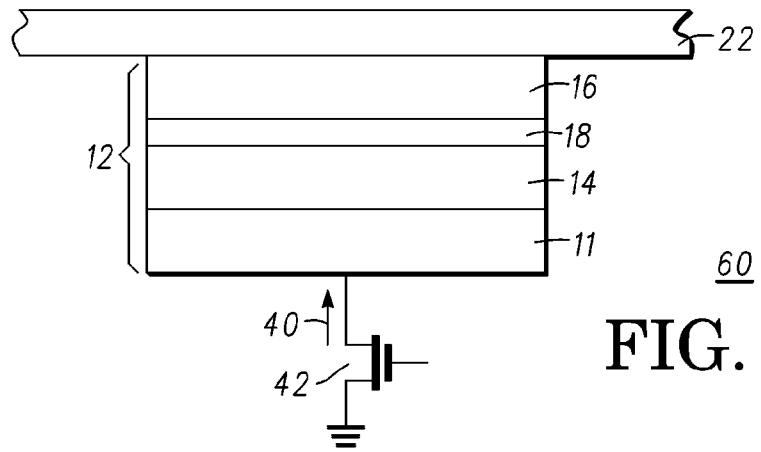
FIG. 3 is a typical spin-torque memory cell.

While ST-MRAM is described in detail, some of the programming and reading techniques described herein may also be implemented in field-switched MRAM and phase change memory. In field-switched MRAM, the STT program current would be replaced by current pulses through two write lines that generate magnetic fields to switch the selected bit. In phase change memory, the reset line would be optimized to generate a heat pulse that resets the plurality of bits into a first resistance state, rather than the magnetic field pulse required for the ST-MRAM embodiment. In ST-MRAM devices such as the structure 60 shown in FIG. 3, the bits are written by using isolation transistor 42 to force a current 40 directly through the stack of materials that make up the memory element 12 (magnetic tunnel junction). Generally speaking, the write current 40 which is spin polarized by passing through one ferromagnetic layer (14 or 16), exerts a spin torque on the subsequent layer. This torque can be used to switch the magnetization of free ferromagnetic layer 16 between two stable states by changing the write current polarity.

Briefly, a current becomes spin-polarized after the electrons pass through the first magnetic layer in a magnet/non-magnet/magnet trilayer structure, where the first magnetic layer is substantially fixed in its magnetic orientation by any one of a number of methods known in the art. The spin-polarized electrons cross the nonmagnetic spacer and then, through conservation of spin angular momentum, exert a spin torque on the second magnetic layer, which switches the magnetic orientation of the second layer to be parallel to the magnetic orientation of the first layer. If a current of the opposite polarity is applied, the electrons instead pass first through the second magnetic layer. After crossing the nonmagnetic spacer, a spin torque is applied to the first magnetic layer. However, since its magnetization is fixed, the first magnetic layer does not switch. Simultaneously, a fraction of the electrons will then reflect off the first magnetic layer and travel back across the nonmagnetic spacer before interacting with the second magnetic layer. In this case, the spin torque acts so as to switch the magnetic orientation of the second layer to be anti-parallel to the magnetic orientation of the first layer. Spin-torque switching occurs only when the current 40 exceeds the critical current $I_C$ of the element. The spin-torque switching current used by the circuit is chosen to be somewhat above the average $I_C$ of the memory elements so that all elements will switch reliably when the switching current is applied.

Figure 4:
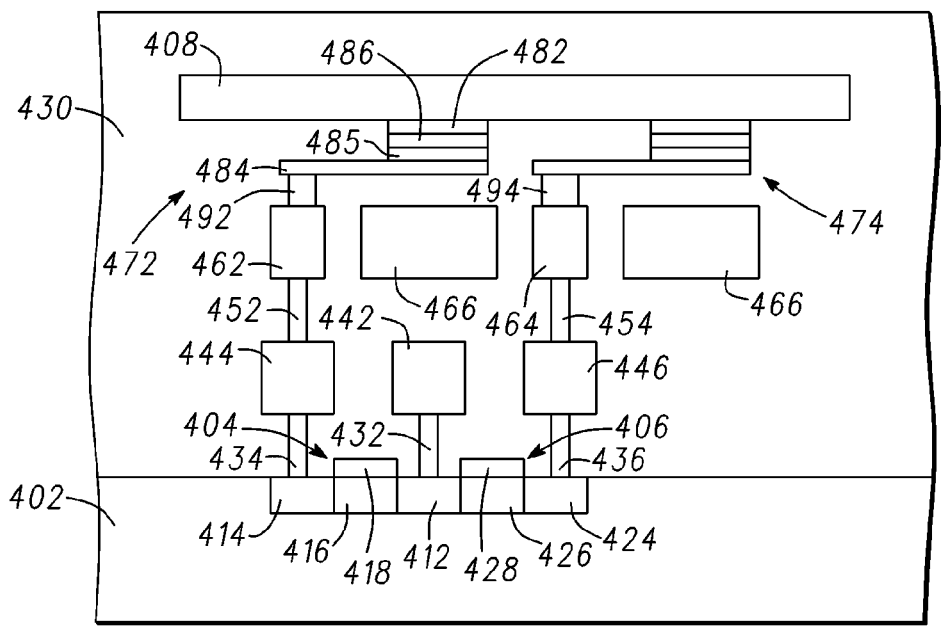
FIG. 4 is an exemplary partial cross section of two cells of an MRAM integrated array.

Referring to FIG. 4, an exemplary magnetoresistive memory array 400 includes switching devices 404 and 406 formed within and on the substrate 402 in a manner well known in the semiconductor industry. The switching devices 404 and 406 are shown as CMOS transistors, but may alternatively be diodes or bipolar transistors as subsequently described in detail. The switching device 404 includes electrodes 412, 414, channel region 416, and gate 418. The switching device 406 includes electrodes 412, 424, channel region 426, and gate 428. In operation, a voltage VSS is applied to the conductive region 442.

Vias 432, 434, 436 are formed in the dielectric material 430 to couple the electrode 412 to conductive region 442, electrode 414 to conductive region 444, and electrode 424 to conductive region 446. Conductive regions 442, 444, 446 are formed in the same processing steps and isolated from each other by processes known in the semiconductor industry. Conductive line 466 is configured to receive a reset voltage and may be also referred to as a reset line. Vias 452 and 454 are formed in the dielectric material 430 to couple the conductive region 444 to conductive region 462, and conductive region 446 to conductive region 464. In the same process steps in which the conductive regions 462 and 464 are formed, a conductive reset line 466 is formed. The reset line 466 preferably includes magnetically permeable cladding material on three sides of the line, along the length of the line, to focus the magnetic field above the fourth side where the MTJ bits are located.

Scalable magnetoresistive memory elements 472, 474 are formed within the dielectric material 430. When MTJ devices are used, each includes a free layer 482 and a fixed region 485 over a bottom electrode 484 and separated by a tunnel barrier 486. In this illustration, only two magnetoresistive memory elements 472, 474 are shown for simplicity in describing the embodiments of the present invention, but it will be understood that an MRAM array may include many magnetoresistive memory elements. The free layer 482 is coupled to a first conductive line 408, and the fixed regions 485 of scalable magnetoresistive memory elements 472, 474 are coupled to conductive regions 462, 464, respectively by bottom electrode 484 and vias 492, 494.

The fixed magnetic region 485 is well known in the art, and conventionally includes a pinned synthetic antiferromagnet, which includes a ferromagnetic fixed layer, a coupling spacer layer, a pinned ferromagnetic layer and an optional antiferromagnetic pinning layer. The fixed ferromagnetic layer is positioned in contact with the tunnel barrier. The coupling spacer layer is position between the fixed ferromagnetic layer and the pinned ferromagnetic layer. The antiferromagnetic pinning layer is underneath and in contact with the pinned ferromagnetic layer. The ferromagnetic fixed and pinned layers each have a magnetic moment vector that are usually held anti-parallel by the coupling spacer layer and held in a fixed direction by the antiferromagnetic pinning layer. Thus the magnetic moment vector of fixed magnetic region 485 is not free to rotate and is used as a reference. The coupling spacer layer is formed from any suitable nonmagnetic material that creates antiparallel coupling between two ferromagnetic layers adjacent to, and in contact with, its opposite surfaces. The coupling layer is typically one that exhibits the oscillatory coupling phenomenon, for example, at least one of the elements Ru, Os, Re, Cr, Rh, Cu, or their combinations, with a thickness chosen for strong antiparallel coupling. The optional pinning layer, may comprise antiferromagnetic materials such as PtMn, IrMn, FeMn, PdMn, or combinations thereof However, it will be appreciated by those skilled in the art that fixed magnetic region 484 may have any structure suitable for providing a fixed magnetic portion in contact with the tunnel barrier to provide a fixed magnetic reference direction.

The free layer 482 has a magnetic moment vector that is free to rotate in response to an applied field or a STT current (discussed hereinafter). In the absence of the STT current, the magnetic moment vector is oriented along the anisotropy easy-axis of the free layer.

The free layer 482 easy axis is oriented at an angle in the range of about 30 degrees to about 60 degrees from the direction of the magnetic field generated by the reset line 466. In a preferred embodiment of the invention, the free layer 482 easy axis is oriented at an angle of about 45 degrees from the direction of the magnetic field generated by the reset line 466. It can be easily shown that for a typical free layer having a Stoner-Wohlfarth-like switching astroid, the switching field is reduced by a factor of 2 if the field is applied at 45 degrees from the easy axis of the bit. Therefore, the current needed to reset the bits is also reduced by a factor of 2, making the reset require less power. The magnetic vector of the free layer 482 is free to rotate in the presence of an applied field or a STT current. The magnetic vector of the fixed layer 485 is not free to rotate in the presence of an applied field or an STT current and is used as the reference layer.

The free layer 482, the fixed layer, and the pinned layer may be formed from any suitable ferromagnetic material, such as at least one of the elements Ni, Fe, Co or their alloys and their other useful alloys incorporating other elements, such as B, Ta, V, Si, and C, as well as so-called half-metallic ferromagnets such as NiMnSb, PtMnSb, $Fe_3O_4$, or $CrO_2$. The tunnel barrier 486 may be comprised of insulating materials such as AlOx, MgOx, RuOx, HfOx, ZrOx, TiOx, or the nitrides and oxidinitrides of these elements.

The dielectric material 430 may be silicon oxide, silicon nitride (SiN), silicon oxynitride (SiON), a polyimide, or combinations thereof The conductive lines 408 and vias 432, 434, 436, 452, 454, 492, 494, are preferably copper, but it will be understood that they may be other materials such as tantalum, tantalum nitride, silver, gold, aluminum, platinum, or another suitable conductive material.

During fabrication of the MRAM array architecture 400, each succeeding layer is deposited or otherwise formed in sequence and each MTJ device 400 may be defined by selective deposition, photolithography processing, etching, etc. using any of the techniques known in the semiconductor industry. Typically the layers of the MTJ are formed by thin-film deposition techniques such as physical vapor deposition, including magnetron sputtering and ion beam deposition, or thermal evaporation. During deposition of at least a portion of the MTJ, a magnetic field is provided to set a preferred anisotropy easy-axis into the material (induced intrinsic anisotropy). In addition, the MTJ stack is typically annealed at elevated temperature while exposed to a magnetic field directed along the preferred anisotropy easy-axis to further set the intrinsic anisotropy direction and to set the pinning direction when an antiferromagnetic pinning layer is used. The provided magnetic field creates a preferred anisotropy easy-axis for a magnetic moment vector in the ferromagnetic materials. In addition to intrinsic anisotropy, memory elements patterned into a shape having aspect ratio greater than one will have a shape anisotropy, and the combination of this shape and the intrinsic anisotropy define an easy axis that is preferably parallel to a long axis of the memory element. In some cases it may be advantageous to employ free layer materials that have a strong perpendicular magnetic anisotropy (PMA) such that the easy axis of the free layer is perpendicular to the film plane and the two stable magnetic states are characterized by a magnetization vector directed generally toward or away from the tunnel barrier. Such PMA materials known in the art include certain ordered L10 alloys such as: FePt, FePd, CoPt, FeNiPt; and certain artificial multilayered structures such as: Co/Pt, Co/Pd, CoCr/Pt, Co/Ru, Co/Au, Ni/Co. If the easy axis of the free layer is perpendicular to the film plane, then the magnetoresistive memory elements 472, 474 will not be centered with respect to the reset lines 466 but rather offset toward one edge of the reset lines 466 so that they experience a significant perpendicular component of the field generated by the reset lines 466.

Figure 14:
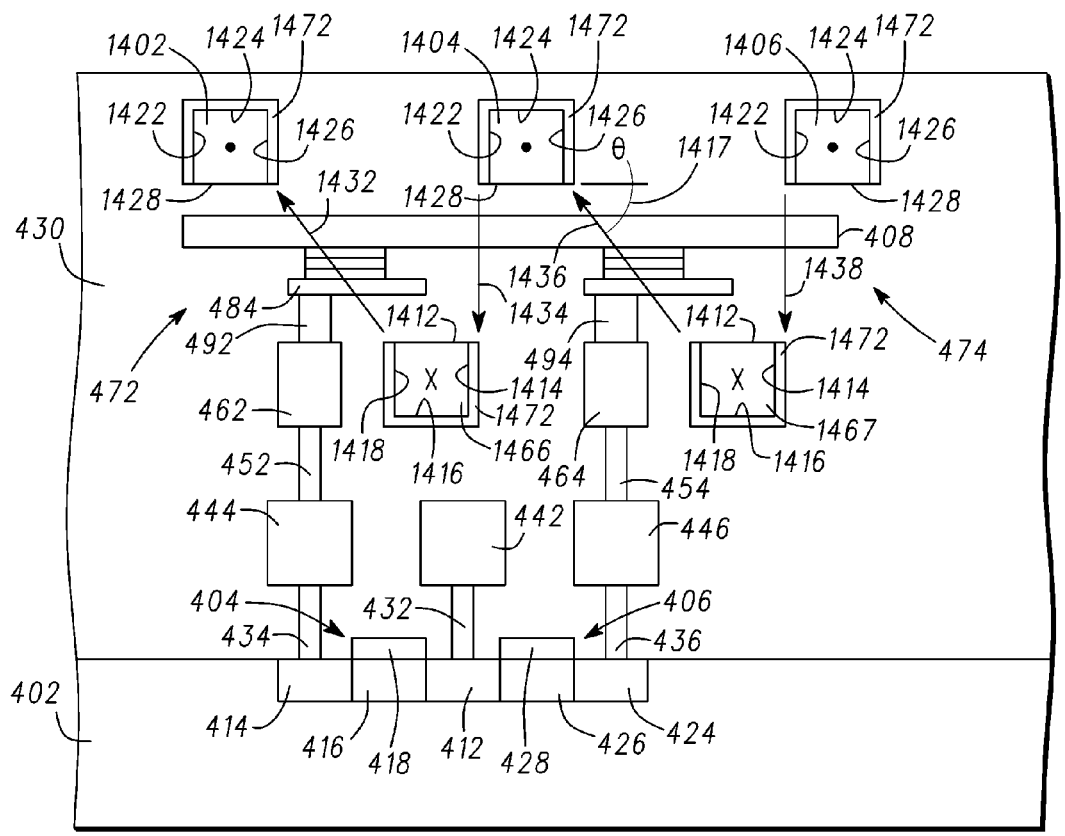
FIG. 14 is still another exemplary cross section of two cells of an MRAM integrated array similar to FIG. 4.

This significant perpendicular component may be created by the structure 1400 of FIG. 14. Elements like those of FIG. 4 bear identical reference numbers; however, the conductive reset lines 466 of FIG. 4 are numbered 1466 and 1467 in FIG. 14. The scalable magnetoresistive memory elements 472, 474 are offset from the conductive reset lines 1466, 1467 and are positioned above the conductive regions 462, 464, respectively. Additional conductive reset lines 1402, 1404, 1406 are positioned above the conductive line 408, and offset from and on an opposed side of the scalable magnetoresistive memory elements 472, 474 from the conductive reset lines 1466 and 1467. Each of the three sides 1414, 1416, 1418 of the conductive reset lines 1466, 1467 may have a cladding material 1472 formed thereon, while the side 1412 adjacent the conductive line 408 (and facing the scalable magnetoresistive memory elements 472, 474) is not cladded. Likewise, each of the three sides 1422, 1424, 1426 of the conductive reset lines 1402, 1404, 1406 may have a cladding material 1472 formed thereon, while the side 1428 adjacent the conductive line 408 (and facing the scalable magnetoresistive memory elements 472, 474) is not cladded. The cladding material 1472 focuses a magnetic field created when a current flows through the conductive reset lines 1402, 1404, 1406, 1466, 1467. The direction of the current through the conductive reset lines 1402, 1404, 1406, 1466, 1467, for example, are indicated by a "dot", indicating the current is flowing from the figure, and a "cross", indicating the current is flowing into the figure. The magnetic field created by the current through the conductive reset lines 1466, 1467, 1402, 1404, 1406 are indicated by the arrows 1432, 1434, 1436, 1438, wherein the magnetic field 1432 is created between the conductive reset lines 1466 and 1402 and focused by the cladding material 1472, the magnetic field 1434 is created between the conductive reset lines 1404 and 1466 and focused by the cladding material 1472, the magnetic field 1436 is created between the conductive reset lines 1467 and 1404 and focused by the cladding material 1472, and the magnetic field 1438 is created between the conductive reset lines 1406 and 1467 and focused by the cladding material 1472. For simplicity, the arrows representing magnetic fields in the figures, such as arrows 1432, 1434, 1436, 1438 in FIG. 14, qualitatively represent an approximate single field line through the center of the bits and are not a complete representation of the magnetic fields generated by the reset lines. A full representation of the fields created between the reset lines when energized can be simulated by one of a number of computer simulation tools known in the art, when inputs are given for specific dimensions and materials. To understand the magnetic field lines qualitatively, one can consider the direction of the magnetic field generated by the lines, and thus the formation of North and South poles along the edges of the cladding material, determined by the well-known right hand rule for magnetic fields generated by current flow. Note that the fields 1432 and 1436 are at an angle θ to the plane of the scalable magnetoresistive memory elements 472, 474. This angle θ is preferably greater than 60 degrees, and more preferably 90 degrees. Pairs of reset lines with opposite currents may be connected in series so that the current is recirculated, traveling the length of one line, then through a connection between the lines, and traveling in the opposite direction, the length of the other line. However, when it is desirable to maximize the number of bits along a reset line, the lines would not be connected in series so that the maximum available voltage can be used to drive the needed current through the length of one line. Because the resistance of a line is proportional to its length, the maximum available drive voltage sets the limit for maximum line length through which the desired reset current can be obtained.

Figure 15:
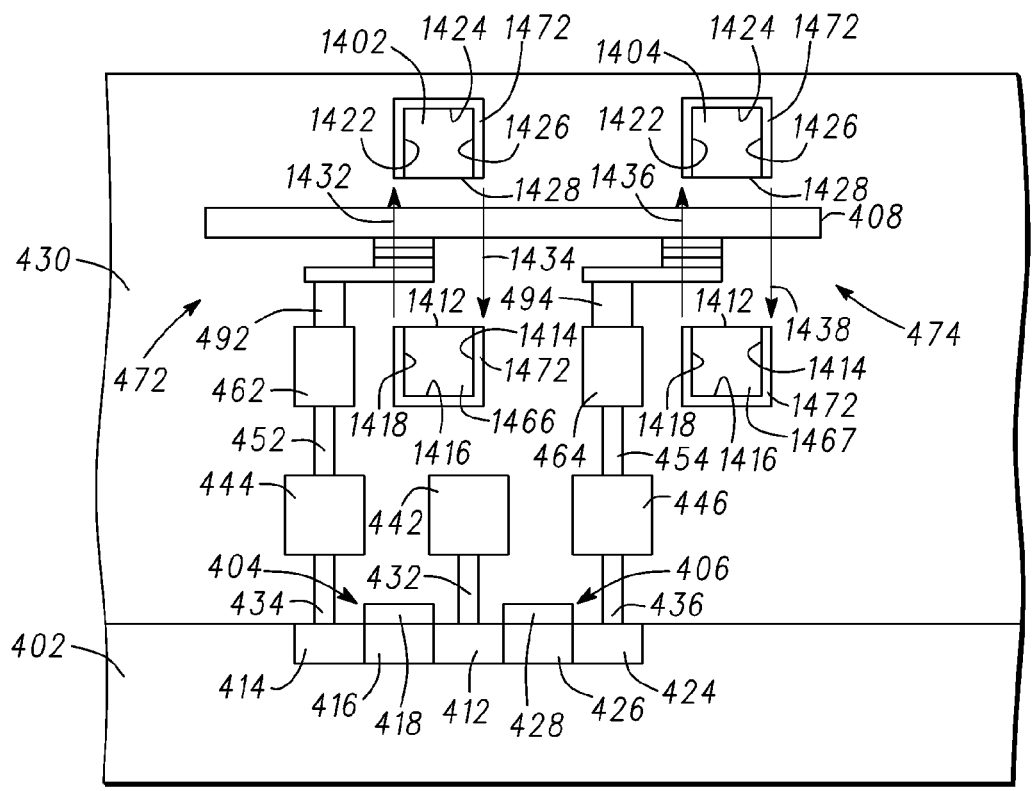
FIG. 15 is another exemplary partial cross section of two cells of an MRAM integrated array similar to FIG. 4.

The structure 1500 of FIG. 15 also may create the perpendicular component of the magnetic field passing through the scalable magnetoresistive memory elements 472, 474. Elements like those of FIG. 14 bear identical reference numbers. However, the scalable magnetoresistive memory elements 472, 474 are offset to overlap the conductive reset lines 1466, 1467, respectively, and conductive reset lines 1402, 1404 are positioned above and in line with the conductive reset lines 1466, 1467, respectively. In a like manner as described above, fields 1432, 1434 are created between conductive reset lines 1402 and 1466, and fields 1436, 1438 are created between conductive reset lines 1404 and 1467. Note that the fields 1432, and 1436 are perpendicular to the scalable magnetoresistive memory elements 472, 474, respectively when the reset current direction is the same for all of the reset lines.

Figure 5:
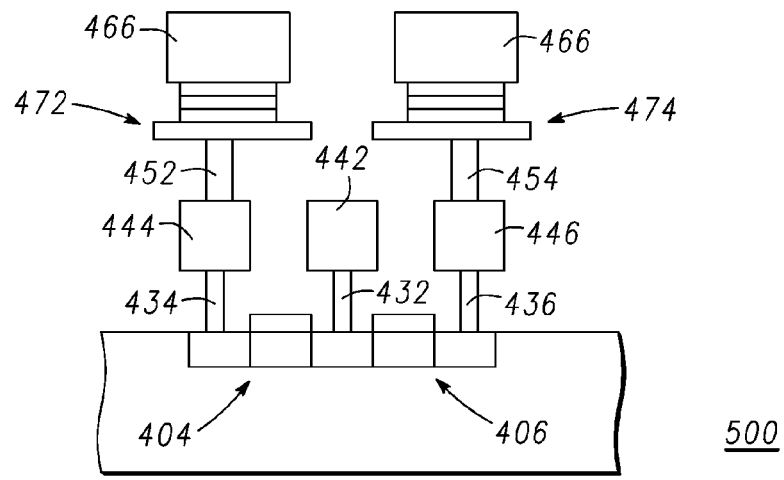
FIG. 5 is another exemplary partial cross section of two cells of a MRAM integrated array.

Another exemplary MRAM array architecture 500 is shown in FIG. 5, wherein like structures are represented by the same reference number. For the substrate 402, switching devices 404, 406, vias 432, 434, 436, 452, 454, conductive regions 442, 444, 446, 466, and magnetoresistive memory elements 472, 474, the fabrication process and material composition are similar to those of FIG. 4 and are not repeated. Differences between the magnetoresistive memory 500 of FIG. 5 and the magnetoresistive memory 400 of FIG. 4 include the position of the conductive regions 466 (program or reset line) over the magnetoresistive memory elements 472, 474, and the conductive region 442 serving as the bit line. The MRAM array architecture 500 provides a small bitcell having increased field generating capability for a given current through reset line 466 since reset line 466 can be located in closer proximity to magnetoresistive memory elements 472, 474.

Figure 6:
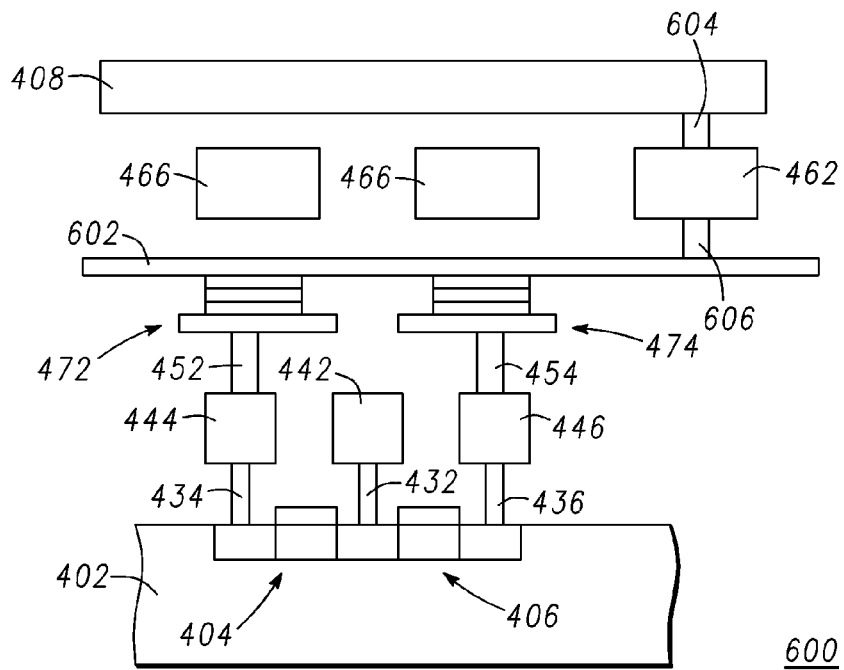
FIG. 6 is yet another exemplary partial cross section of two cells of a MRAM integrated array.

Yet another exemplary MRAM array architecture 600 is shown in FIG. 6, wherein like structures are represented by the same reference number. For the substrate 402, switching devices 404, 406, vias 432, 434, 436, 452, 454, conductive regions 442, 444, 446, 466, conductive bit line 408, and magnetoresistive memory elements 472, 474, the fabrication process and material composition are similar to those of FIG. 4 and are not repeated. The conductive region 442 is configured to receive a voltage VSS and the conductive layer 408 functions as the bit line. Differences between the magnetoresistive memory 600 of FIG. 6 and the magnetoresistive memory 400 of FIG. 4 include the position of the reset lines 466 over, and spaced from, the magnetoresistive memory elements 472, 474. The magnetoresistive memory 600 structure provides a small bitcell similar to 500, however, eliminates any negative impact of the voltage drop down reset line 466 on the sensing operation and the application of STT current by electrically isolating reset line 466 from magnetoresistive memory elements 472, 474 (similar to memory 400). If the easy axis of the free layer is perpendicular to the film plane, then the magnetoresistive memory elements 472, 474 will not be centered with respect to the reset lines 466 but rather offset toward one edge of the reset lines 466 so that they experience a significant perpendicular component of the field generated by the reset lines 466.

Figure 16:
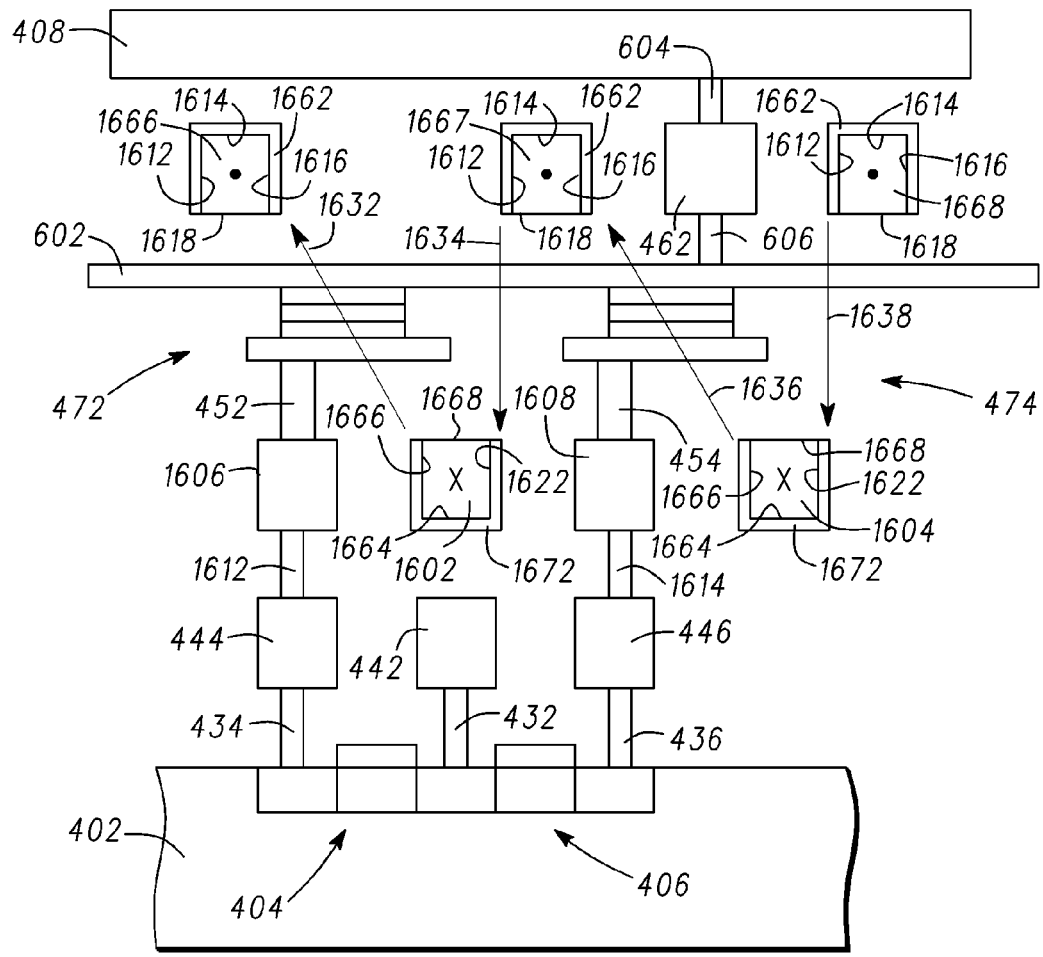
FIG. 16 is an exemplary partial cross section of two cells of an MRAM integrated array similar to FIG. 6.

Referring to FIG. 16, a significant perpendicular component of the field may be created by the structure 1600. Elements of FIG. 16 like those of FIG. 6 bear identical reference numbers. However, the conductive reset lines 466 of FIG. 6 are numbered 1666, 1667 and 1668 in FIG. 16. The conductive reset lines 1666, 1667, 1668 are offset from the scalable magnetoresistive memory elements 472, 474. Conductive reset lines 1602, 1604 are positioned below, and displaced from, the conductive line 608, and offset from the scalable magnetoresistive memory elements 472, 474. Conductive regions 1606 and 1608 are deposited in the same process as the conductive reset lines 1602, 1604 and are coupled to the conductive regions 444, 446, respectively, by vias 1612 and 1614. Each of the three sides 1612, 1614, 1616 of the conductive reset lines 1666, 1667, 1668 may have a cladding material 1662 formed thereon, while the side 1618 adjacent the conductive line 602 is not cladded. Likewise, each of the three sides 1622, 1624, 1626 of the conductive reset lines 1602, 1604, may have a cladding material 1672 formed thereon, while the side 1628 adjacent the conductive line 602 (and facing the scalable magnetoresistive memory elements 472, 474) is not cladded. The cladding material 1672 focuses a field created when a current flows through the conductive reset lines 1602, 1604. The cladding material 1662 focuses a field created when a current flows through the conductive reset lines 1666, 1667, 1668. The direction of the current through the conductive reset lines, for example, are indicated by a "dot", indicating the current is flowing from the figure, and a "cross", indicating the current is flowing into the figure. The field created by the current through the conductive reset lines 1666, 1667, 1668, 1602, 1604 are indicated by the arrows 1632, 1634, 1636, 1638, wherein the field 1632 is created between the conductive reset lines 1666 and 1602 and focused by the cladding materials 1662 and 1672, the field 1634 is created between the conductive reset lines 1602 and 1667 and focused by the cladding materials 1672 and 1662, the field 1636 is created between the conductive reset lines 1667 and 1604 and focused by the cladding materials 1662 and 1672, and the field 1638 is created between the conductive reset lines 1604 and 1668 and focused by the cladding materials 1672 and 1662. Note that the fields 1632 and 1636 are at an angle $\theta$ to the plane of the scalable magnetoresistive memory elements 472, 474. The angle $\theta$ is preferably greater than 60 degrees, and more preferably about 90 degrees. Pairs of reset lines with opposite currents may be connected in series so that the current is recirculated, traveling the length of one line, then through a connection between the lines, and traveling in the opposite direction, the length of the other line. However, when it is desirable to maximize the number of bits along a reset line, the lines would not be connected in series so that the maximum available voltage can be used to drive the needed current through the length of one line. Because the resistance of a line is proportional to its length, the maximum available drive voltage sets the limit for maximum line length through which the desired reset current can be obtained.

Figure 17:
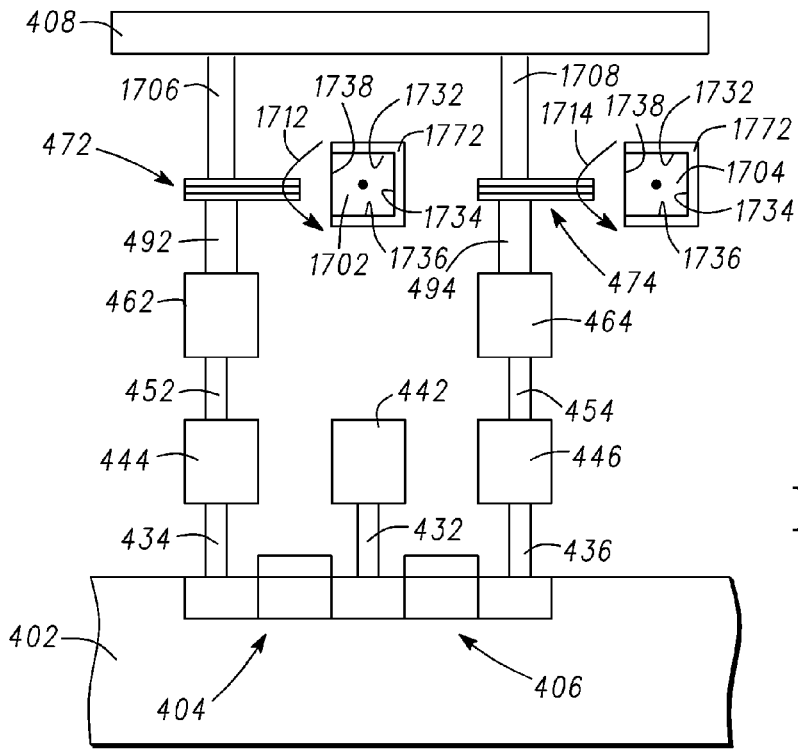
FIG. 17 is yet another exemplary partial cross section of two cells of an MRAM integrated array.

Another embodiment for creating a field perpendicular to the scalable magnetoresistive memory elements 472, 474 is shown in FIG. 17, wherein elements like those of FIG. 4 bear identical reference numbers. Conductive reset lines 1702, 1704 are formed adjacent scalable magnetoresistive memory elements 472, 474, with vias 1706, 1708 respectively coupling the scalable magnetoresistive memory elements 472, 474 to the conductive line 408. Each of the three sides 1732, 1734, 1736 of the conductive reset lines 1702, 1704 may have a cladding material 1772 formed thereon, while the sides 1738 adjacent the scalable magnetoresistive memory element 472, 474 are not cladded. When a current (flowing in a direction from the figure by the dot) passes through the conductive reset line 1702 and focused by the cladding material 1772, the magnetic field 1712 is created. Likewise, when a current (flowing in a direction from the figure by the dot) passes through the conductive reset line 1704 and focused by the cladding material 1772, the magnetic field 1714 is created. It is seen that the magnetic fields 1712, 1714 pass through the scalable magnetoresistive memory elements 472, 474 perpendicularly.

Figure 18:
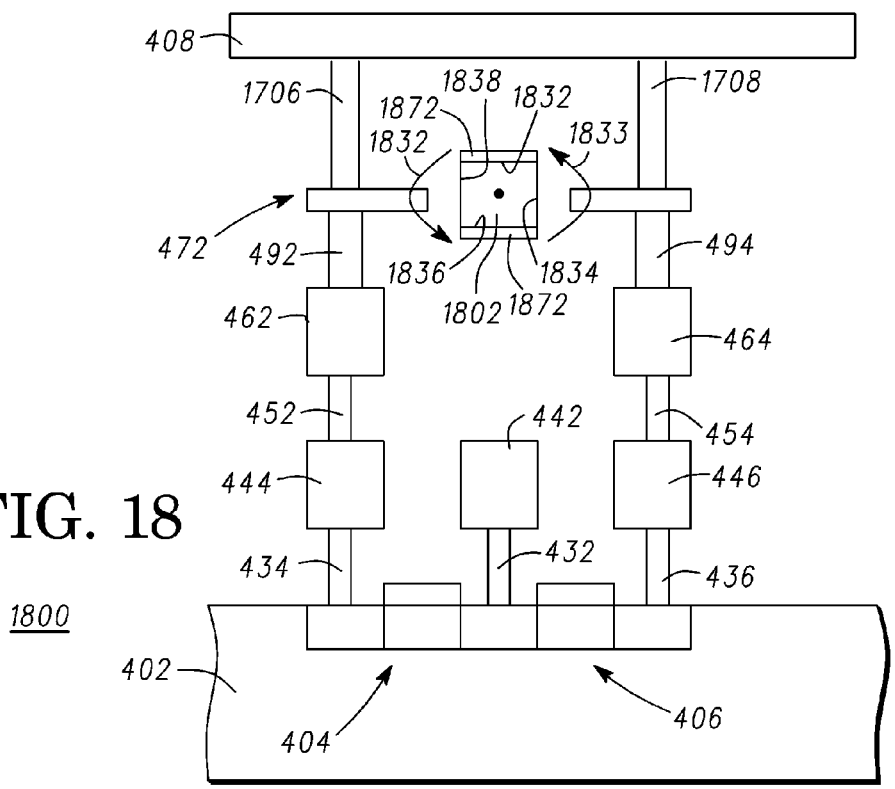
FIG. 18 is still another exemplary partial cross section of two cells of an MRAM integrated array.

Still another structure for creating a field perpendicular to the scalable magnetoresistive memory elements 472, 474 is shown in FIG. 18, wherein elements like those of FIG. 17 bear identical reference numbers. A conductive reset line 1802 is formed adjacent scalable magnetoresistive memory elements 472, 474. Two sides 1832, 1836 of the conductive reset line 1802 located above and below the film plane of scalable magnetoresistive memory elements 472, 474 may have a cladding material 1872 formed thereon, while the sides 1838, 1834 adjacent the scalable magnetoresistive memory elements 472, 474 are not cladded. When a current (flowing in a direction from the figure by the dot) passes through the conductive reset line 1802 and focused by the cladding material 1872, the magnetic fields 1832, 1833 are created, which pass through the scalable magnetoresistive memory elements 472, 474 perpendicularly. It should be understood, while only two scalable magnetoresistive memory elements 472, 474 and only one conductive reset line 1802 are shown, a plurality of scalable magnetoresistive memory elements 472, 474 and conductive reset lines 1802 may be formed, with at least one pair of the scalable magnetoresistive memory elements 472, 474 positioned on both sides of the conductive reset lines 1802.

For the magnetoresistive memory structures 400, 500, 600, 1500, 1600, 1700, 1800 discussed above, a current is applied through the reset lines positioned contiguous to each of the plurality of magnetoresistive memory elements 472, 474 to create and apply a magnetic field to the plurality of magnetoresistive memory elements 472, 474 and set each of the magnetoresistive memory elements 472, 474 to a first state. An STT current is then applied to selected ones of the plurality of magnetoresistive memory elements to change the state of the selected magnetoresistive memory elements 472, 474 to a second state. More specifically, referring to the flow chart of FIG. 7, a method is provided for programming an ST-MRAM including setting 702 the plurality of magnetoresistive memory elements 472, 474 to a first state by applying a current through reset lines to apply a magnetic field to each of the plurality of magnetoresistive memory elements 472, 474, and programming 704 selected ones of the plurality of magnetoresistive memory elements 472, 474 to a second state by applying a STT current to the selected magnetoresistive memory elements 472, 474 from circuitry 404, 406 through the bit line 408 (FIGS. 4, 6, 14, 15, 16, 17, 18) and 442 (FIG. 5).

In an alternative embodiment, during reset of the memory elements a current is also passed through the memory elements in addition to the current applied through the reset lines. The current passing through the memory elements can be large enough to cause magnetic heating of the free layer so that the magnetization of the free layer and the corresponding switching field of the memory element is reduced. With a reduced switching field, the reset field and reset current are reduced, which is desirable for both for lower power and flexibility in circuit design. The magnitude of the heating current can be similar to that required for ST switching, and the polarity can be the same. Although the ST on the free layer opposes the switching torque generated by the magnetic field, the field torque dominates so that the memory elements are reset into the correct state. In a preferred method of this alternative embodiment, the heating current is turned off before the field reset current is reduced to zero.

A method of reading data from the ST-MRAM includes first sensing the resistance of each of the magnetoresistive memory elements 472, 474 followed by a current being applied through the reset lines positioned contiguous to each of the plurality of magnetoresistive memory elements 472, 474 to create and apply a magnetic field to the plurality of magnetoresistive memory elements 472, 474 and set each of the magnetoresistive memory elements 472, 474 to a first state. A second sensing is then performed to sense the resistance of the magnetoresistive memory elements 472, 474. The magnetoresistive memory elements 472, 474 that have changed resistance corresponding to a change in magnetic state from the first sensing to the second sensing are identified. The sequence of memory elements that have or have not changed resistance corresponding to a change in magnetic state represents the data that was stored in the magnetoresistive memory elements. An STT current is then applied to the identified magnetoresistive memory elements 472, 474 to change the state of the identified magnetoresistive memory elements 472, 474 to a second state. More specifically, referring the flow chart of FIG. 8, a method is provided for reading a ST-MRAM including sensing 802 a resistance for each of the plurality of magnetoresistive memory elements 472,474, setting 804 the plurality of magnetoresistive memory elements 472, 474 to a first state by applying a current through reset lines to apply a reset field to each of the plurality of magnetoresistive memory elements 472, 474, sensing 806 a change in at least one of the magnetoresistive memory elements that changed magnetic state in response to the reset field, and programming 808 at least one of the magnetoresistive memory elements 472, 474 having the change in resistance to a second state by applying a STT current to the selected magnetoresistive memory element 472, 474 from circuitry 404, 406 through the bit line 408 (FIGS. 4, 6) and 442 (FIG. 5), thus returning the plurality of MTJ bits back to their original states.

A method of operation of the ST-MRAM circuit includes storing the data that has been read from the plurality of magnetoresistive memory elements 472, 474 into associated circuitry, such as a plurality of latches, allowing the user to perform read operations from the circuitry and write operations to the circuitry that may change one or more of the stored states in the stored data, and the writing of those stored states to the plurality of magnetoresistive memory elements 472, 474. More specifically, referring the flow chart of FIG. 9, a method is provided for programming a magnetoresistive memory including sensing 902 a resistance for each of the plurality of magnetic field generator structure 472,474, setting 904 the magnetoresistive memory elements 472, 474 to a first state by applying a current through reset lines to apply a reset field to each of the magnetoresistive memory elements 472, 474, sensing 906 a change in the resistance of any of the plurality of magnetoresistive memory elements 472, 474, identifying 908 and storing data representing the initial states of the magnetoresistive memory elements 472, 474 into associated circuitry, changing 910 one or more of the stored states in the stored data in the associated circuitry, and, in response to the stored data, programming 912 certain magnetoresistive memory elements 472, 474 to a second state as needed to represent the stored data by applying a STT current to the selected magnetoresistive memory elements 472, 474 from circuitry 404, 406 through the bit line 408 (FIGS. 4, 6) and 442 (FIG. 5).

Figure 8:
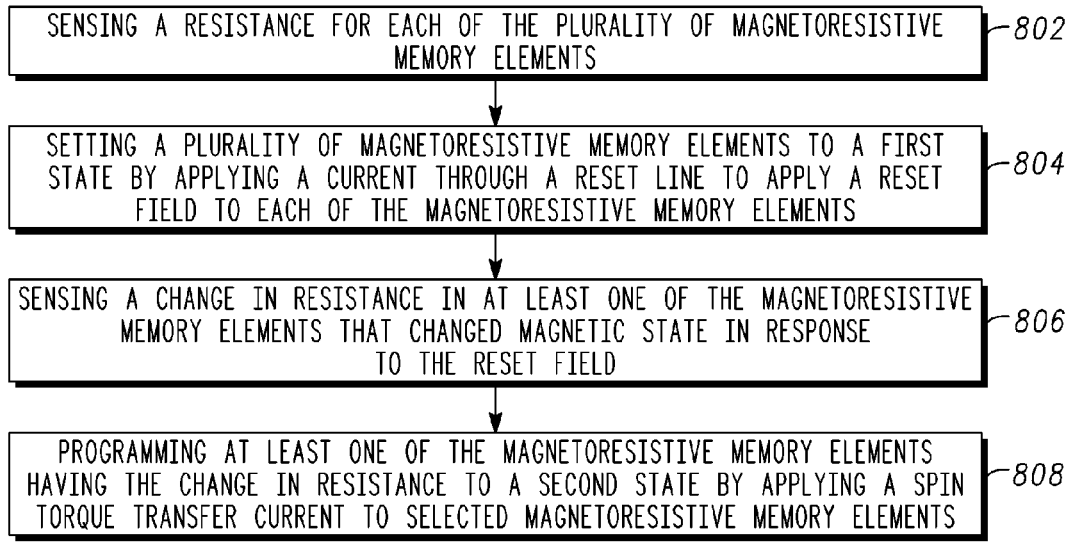
FIG. 8 is flow chart of a method of operation for reading the MRAM integrated arrays of FIGS. 4, 5, and 6.
Figure 9:
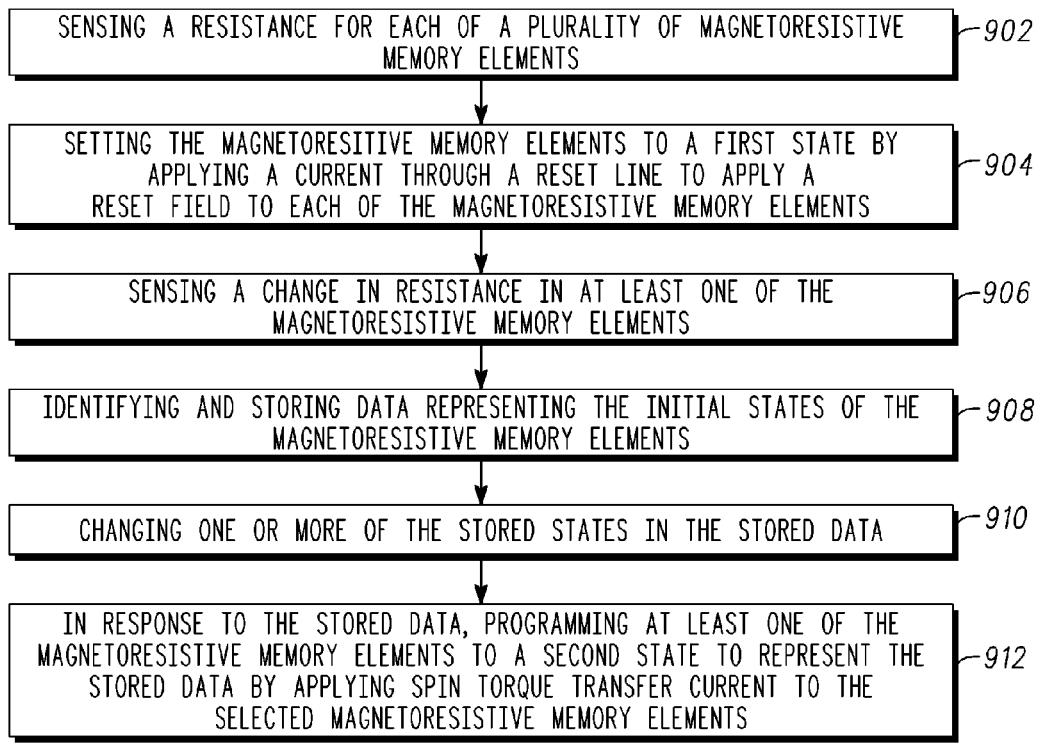
FIG. 9 is a flow chart of a method of operation for reading and programming the MRAM integrated arrays of FIGS. 4, 5, and 6.
Figure 10:
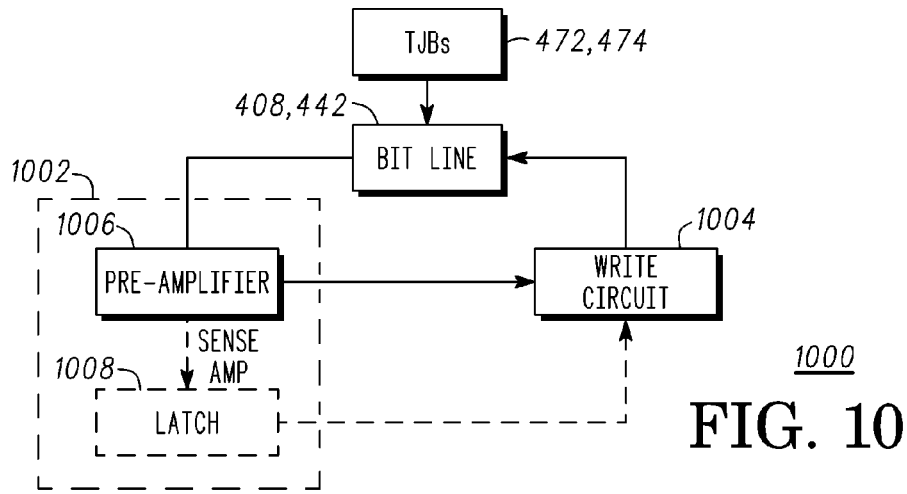
FIG. 10 is a block diagram of an exemplary embodiment including a sense amplifier and write circuit.

FIG. 10 is a block diagram of a typical sensing circuit 1000 that may be used in the magnetoresistive memories 400, 500, 600, 1500, 1600, 1700, 1800 for the method of FIG. 8 to program the magnetoresistive memory elements by sensing the resistance of each of the magnetoresistive bits 472, 474. A sense amplifier 1002 and a write circuit 1004 are coupled to the bit line 408 of FIGS. 4 and 6 and bit line 442 of FIG. 5. The sense amplifier 1002 senses the resistance of the magnetoresistive memory elements 472, 474 and provides data out to the write circuitry 1004, which is used to program the magnetoresistive memory elements 472, 474. For the method of FIG. 9, the sense amplifier includes a pre-amp 1006 and a latch 1008. The resistance sensed by preamp 1006 is stored as data in the latch 1008. A user may change (step 910) the data prior to magnetoresistive memory elements bits being programmed.

Figure 7:
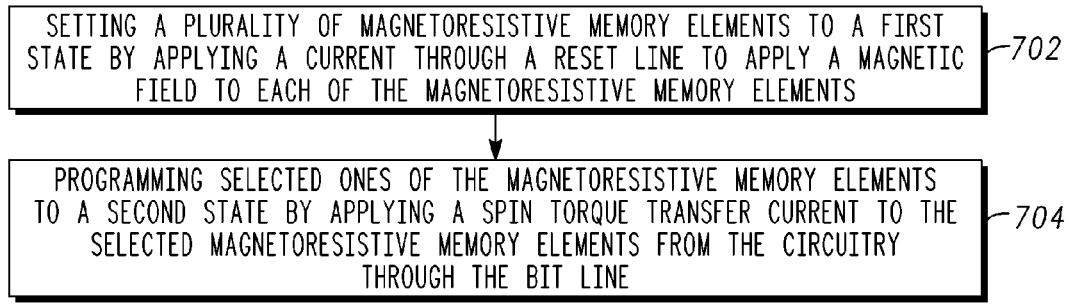
FIG. 7 is a flow chart of a method of operation for programming the MRAM integrated arrays of FIGS. 4, 5, and 6.

The flow charts of FIGS. 7, 8, 9 are examples suitable for use with a magnetoresistive memory. It should be appreciated that the methods may include any number of additional or alternative tasks, the tasks shown and discussed need not be performed in the illustrated order, and additional steps may be incorporated into a more comprehensive procedure or process having additional functionality not described in detail herein. Moreover, one or more of the tasks shown and described could be omitted from one of the methods as long as the intended overall functionality remains intact.

Figure 11:
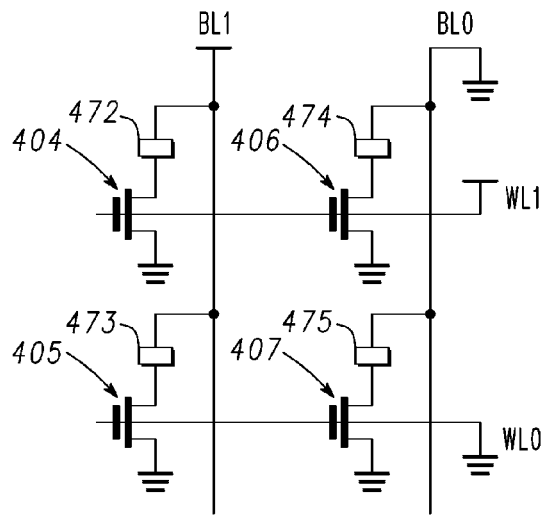
FIG. 11 is a schematic diagram of an exemplary embodiment including NMOS transistors for providing a unidirectional read current and a spin torque transfer current within the MRAM integrated arrays of FIGS. 4 and 6.

The magnetoresistive memories 400, 500, 600, 1500, 1600, 1700, 1800 as shown in FIGS. 4, 5, 6, 14, 15, 16, 17, 18 include a NMOS as the switching devices 404, 406, and as represented in the schematic diagram of FIG. 11. Switching devices 404, 405, are coupled between the bit line BL1 and ground, and switching devices 406, 407 are coupled between bit line BL0. Magnetoresistive memory elements 472, 473 are coupled between bit line BL0 and an electrode of the switching devices 404, 405, respectively. The magnetoresistive memory elements 474, 475 are coupled between bit line BL0 and an electrode of the switching devices 406, 407, respectfully. The gates of switching devices 404, 406 are coupled to the word line WL1, and the gates of switching devices 405, 407 are coupled to the word line WL0 This configuration of switching devices 404, 405, 406, 407 in allows for a unidirectional STT current to program the magnetoresistive memories 400, 500, 600, 700. Also shown are exemplary conditions for voltages applied to BL0, BL1, WL0, and WL1 necessary to apply STT current or a read bias current through magnetoresistive memory element 472 while no current is applied to magnetoresistive memory elements 473, 474, 475. Applying a voltage to the gates of NMOS devices 404 and 406 enables a current path to ground at the bottom electrode of magnetoresistive memory elements 472 and 474, while applying ground to the gates of NMOS devices 405 and 407 maintains an open circuit at the bottom electrodes of magnetoresistive memory elements 473 and 475. In addition, applying a positive voltage, such as VDD, to BL1 causes current to flow through magnetoresistive memory element 472, but not through magnetoresistive memory element 473. Applying ground to BL0 prevents current from flowing through either magnetoresistive memory element 474 or 475.

Figure 12:
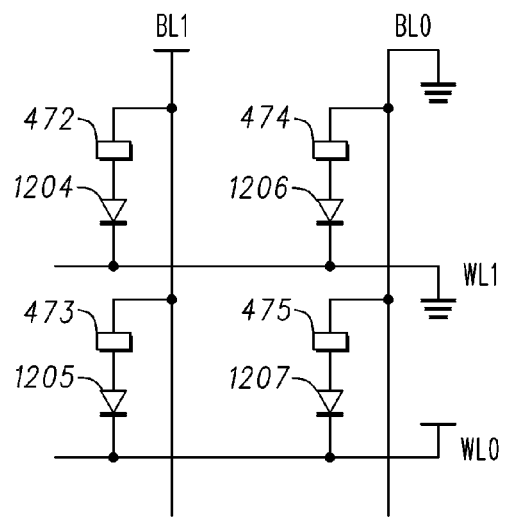
FIG. 12 is a schematic diagram of an exemplary embodiment including diodes for providing a unidirectional read current and a spin torque transfer current within the MRAM integrated arrays of FIGS. 4 and 6.
Figure 13:
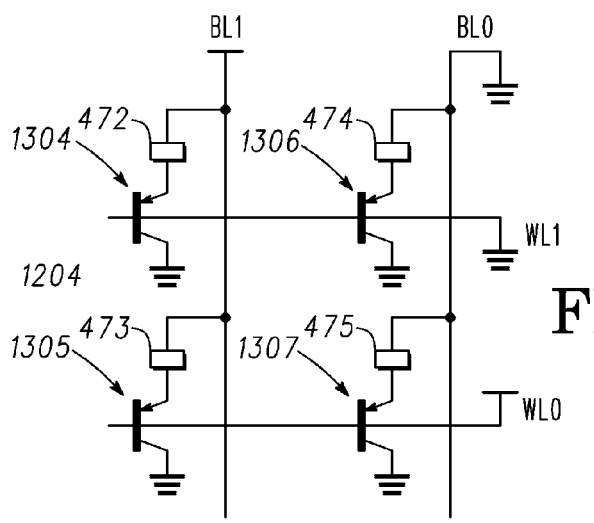
FIG. 13 is a schematic diagram of an exemplary embodiment including bipolar transistors for providing a unidirectional read current and a spin torque transfer current within the MRAM integrated arrays of FIGS. 4 and 6.

These switching devices 404, 405, 406, 407 may alternatively comprise diodes 1204, 1205, 1206, 1207 (FIG. 12) or bipolar transistors 1304, 1305, 1306, 1307 (FIG. 13). Similar to FIG. 11, the exemplary voltage conditions shown on BL0, BL1, WL0, and WL1 demonstrate selectively applying current through magnetoresistive memory element 472 while no current is applied to magnetoresistive memory elements 473, 474, and 475. Specifically, in FIG. 12, applying a positive voltage, such as VDD, to BL1 and WL0 while applying ground to BL0 and WL1 causes diode 1204 to be forward biased and conduct current through magnetoresistive memory element 472, while diodes 1205, 1206, and 1207 are reverse biased and no current flows through magnetoresistive memory elements 473, 474, and 475. In FIG. 13, the same voltage conditions as described in FIG. 12 forward bias the base-emitter terminals of BJT 1304 and cause current to flow through magnetoresistive memory element 472 to the collector of BJT 1304 to ground while the base emitter terminals of BJTs 1305, 1306, and 1307 remain reversed biased and no current flows through magnetoresistive memory elements 473, 474, and 475. With these examples, it can be seen how current may be selectively applied to one or more magnetoresistive memory elements in an array containing several rows and several columns of magnetoresistive memory elements.

It is understood that instead of forming the transistors 404, 405, 406, 407, diodes 1204, 1205, 1206, 1207, or bipolar transistors 1304, 1305, 1306, 130 in the substrate as shown in FIGS. 4, 5, 6, 14, 15, 16, 17, 18, they may be formed between metal layers enabling the possibility of multiple vertical layers of memory elements.

It has been shown that the magnetoresistive memories 400, 500, 600, 1400, 1500, 1600, 1700, 1800 structures and methods of operation therefore enable a faster self-referenced read operation, reduce the power requirement when performing a self-referenced read operation to a plurality of bits, or enable a memory to function with ST-MRAM switching that requires current be applied through the MTJ in only one direction.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A spin-torque magnetoresistive memory comprising:
    a plurality of magnetoresistive memory elements formed from a plurality of layers defining a film plane;
    a first conductive reset line positioned adjacent each of the plurality of magnetoresistive memory elements and configured to set the plurality of magnetoresistive memory elements to a known magnetic state having magnetization perpendicular to the film plane by generating a magnetic field with a predominant component perpendicular to the film plane when an electrical current of predetermined magnitude, duration, and direction flows through the first conductive reset line;
    a first permeable ferromagnetic material positioned on at least one side of the first conductive reset line and having at least one edge positioned parallel to the film plane and outside of the film plane;
    a bit line coupled to the plurality of magnetoresistive memory elements; and
    circuitry coupled to the bit line and configured to apply a spin torque transfer current through the bit line to selected ones of the plurality of magnetoresistive memory elements.

2. The spin-torque magnetoresistive memory of claim 1, wherein the first conductive reset line is configured to generate a magnetic field at an angle of about 90 degrees to the film plane of the plurality of layers of each of the magnetoresistive memory elements.

3. The spin-torque magnetoresistive memory of claim 1 further comprising:
    a second conductive reset line positioned adjacent each of the plurality of magnetoresistive memory elements, wherein the first and second conductive reset lines generate the magnetic field therebetween, and;
    a second permeable ferromagnetic material positioned on at least one side of the second conductive reset line and having at least one edge positioned parallel to the film plane and outside of the film plane on a side of the film plane opposed to at least one edge of the first permeable ferromagnetic material positioned on the first conductive reset line.

4. The spin-torque magnetoresistive memory of claim 3, wherein each of the plurality of magnetoresistive memory elements are positioned between the first and second conductive reset lines, the first and second conductive reset lines positioned on opposed sides of the film plane of the plurality of layers.

5. The spin-torque magnetoresistive memory of claim 4, wherein the first permeable ferromagnetic material is positioned on three sides of the first conductive reset line and the second permeable ferromagnetic material is positioned on three sides of the second conductive reset line and the reset lines are configured to focus the magnetic field generated by a current flowing through each of the first and second conductive reset lines such that the magnetic field has a maximum perpendicular component applied to the plurality of magnetoresistive elements.

6. The spin-torque magnetoresistive memory of claim 4, further comprising:
    a second conductive reset line positioned adjacent each of the plurality of magnetoresistive memory elements and configured to set the plurality of magnetoresistive memory elements to a known magnetic state having magnetization perpendicular to the film plane by generating a magnetic field with a predominant component perpendicular to the film plane when an electrical current of predetermined magnitude, duration, and direction flows through the second conductive reset line, the first and second conductive reset lines positioned on opposed side of each of the plurality of magnetoresistive memory elements and configured to have a current flow through the first and second conductive reset lines in the same direction.

7. The spin-torque magnetoresistive memory of claim 1, wherein the first conductive reset line is positioned in the film plane of the plurality of layers.

8. The spin-torque magnetoresistive memory of claim 7, wherein the first permeable ferromagnetic material is positioned on the first conductive reset line on a first side of the film plane and a second permeable ferromagnetic material positioned on the first conductive reset line on a second side of the film plane, the first and second permeable ferromagnetic material configured to focus the magnetic field generated by a current flowing through the first conductive reset line such that the field has a maximum perpendicular component applied to the plurality of magnetoresistive elements.

9. The spin-torque magnetoresistive memory of claim 8, wherein the first conductive reset line is spaced adjacent to two of the magnetoresistive memory elements and is configured with the first and second permeable ferromagnetic material lying on opposed sides of the film plane to apply the magnetic field to both of the adjacent two magnetoresistive memory elements.

10. The spin-torque magnetoresistive memory of claim 9, wherein the first conductive line is configured to focus the magnetic field generated by a current flowing through the first conductive reset line towards both of the two magnetoresistive memory elements with a dominant magnetic field component perpendicular to the film plane and in a first direction for one of the two magnetoresistive memory elements and in a second direction for the other of the two magnetoresistive memory elements.

11. The spin-torque magnetoresistive memory of claim 7, further comprising:
    the first permeable ferromagnetic material positioned on three sides of the first conductive reset line, and
    a first side of the first conductive reset line positioned on a first side of the film plane, a second side of the first conductive reset line on a second side of the film plane, and a third side of the first conductive reset line perpendicular to the film plane, wherein the permeable ferromagnetic material is configured to focus the magnetic field generated by a current flowing through the first conductive reset line such that the field has a maximum perpendicular component applied to the plurality of magnetoresistive elements located adjacent to a fourth side of the first conductive reset line that has no permeable ferromagnetic material positioned thereon.

12. A method of operating a spin-torque magnetoresistive memory including a bit line coupled to each of a plurality of magnetoresistive memory elements, circuitry coupled to the bit line, and a first conductive reset line positioned near the plurality of magnetoresistive memory elements, each of the magnetoresistive memory elements defining a plane having a magnetic easy axis perpendicular to the plane, the method comprising:

setting the plurality of magnetoresistive memory elements to a first state by applying a reset current through the first conductive reset line to apply a predominate component of a focused magnetic field perpendicular to the plane of each of the plurality of magnetoresistive memory elements; and programming selected ones of the plurality of magnetoresistive memory elements to a second state by applying a spin torque transfer current through the selected magnetoresistive memory elements from the circuitry to the bit line.

13. The method of claim 12 wherein the setting step comprises applying the magnetic field at 90 degrees to the plane.

14. The method of claim 12 wherein the magnetoresistive memory elements each comprise a magnetic tunnel junction device with a fixed magnetic region and a free magnetic region separated by a tunnel barrier.

15. The method of claim 12 wherein the setting step comprises creating the magnetic field between the first conductive reset line and a second conductive line positioned on opposed sides of each of the magnetoresistive memory elements.

16. The method of claim 12 wherein the setting step comprises creating the magnetic field by the first conductive reset line positioned adjacent each of the magnetoresistive memory elements.

17. The method of claim 12 wherein the setting step comprises creating the magnetic field within two magnetoresistive memory elements by the conductive reset line positioned therebetween.

18. The method of claim 12 wherein the setting step comprises focusing the magnetic field by positioning a permeable ferromagnetic material around a portion of the first conductive reset line.

* * * * *